(12) United States Patent
Then et al.

(10) Patent No.: US 10,777,671 B2
(45) Date of Patent: Sep. 15, 2020

(54) LAYERED SPACER FORMATION FOR ULTRASHORT CHANNEL LENGTHS AND STAGGERED FIELD PLATES

(71) Applicant: Intel Corporation, Santa Clara, CA (US)

(72) Inventors: Han Wui Then, Portland, OR (US); Sansaptak Dasgupta, Hillsboro, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/321,411

(22) PCT Filed: Sep. 30, 2016

(86) PCT No.: PCT/US2016/055020
§ 371 (c)(1),
(2) Date: Jan. 28, 2019

(87) PCT Pub. No.: WO2018/063399
PCT Pub. Date: Apr. 5, 2018

(65) Prior Publication Data
US 2020/0066889 A1 Feb. 27, 2020

(51) Int. Cl.
*H01L 29/423* (2006.01)
*H01L 29/778* (2006.01)
(Continued)

(52) U.S. Cl.
CPC ...... *H01L 29/7786* (2013.01); *H01L 29/0847* (2013.01); *H01L 29/2003* (2013.01); *H01L 29/402* (2013.01)

(58) Field of Classification Search
CPC ......... H01L 27/14614; H01L 29/41783; H01L 29/42352; H01L 29/42363; H01L 29/7428
See application file for complete search history.

(56) References Cited

U.S. PATENT DOCUMENTS

| 9,324,831 B2 | 4/2016 | Zschatzsch et al. |
| 2008/0121985 A1 | 5/2008 | Chen et al. |

(Continued)

OTHER PUBLICATIONS

International Search Report and Written Opinion for International Patent Application No. PCT/US2016/055020 dated Jun. 21, 2017, 9 pgs.

(Continued)

*Primary Examiner* — Hoai V Pham
(74) *Attorney, Agent, or Firm* — Schwabe, Williamson & Wyatt, P.C.

(57) ABSTRACT

Embodiments of the invention include a semiconductor device and methods of forming such devices. In an embodiment, the semiconductor device includes a source region, a drain region, and a channel region formed between the source region and drain region. In an embodiment, a first interlayer dielectric (ILD) may be formed over the channel region, and a first opening is formed through the first ILD. In an embodiment, a second ILD may be formed over the first ILD, and a second opening is formed through the second ILD. Embodiments of the invention include the second opening being offset from the first opening. Embodiments may also include a gate electrode formed through the first opening and the second opening. In an embodiment, the offset between the first opening and the second opening results in the formation of a field plate and a spacer that reduces a gate length of the semiconductor device.

17 Claims, 9 Drawing Sheets

(51) Int. Cl.
  *H01L 29/08* (2006.01)
  *H01L 29/20* (2006.01)
  *H01L 29/40* (2006.01)

(56) References Cited

U.S. PATENT DOCUMENTS

2011/0254093 A1   10/2011  Wang et al.
2014/0138750 A1    5/2014  Wu et al.
2015/0228790 A1    8/2015  Hsu et al.
2015/0311084 A1*  10/2015  Moore .............. H01L 29/66462
                                                                          257/280

OTHER PUBLICATIONS

International Preliminary Report on Patentability for International Patent Application No. PCT/US2016/055020 dated Apr. 11, 2019, 6 pgs.

* cited by examiner

LAYERED SPACER FORMATION FOR ULTRASHORT CHANNEL LENGTHS AND STAGGERED FIELD PLATES

CROSS-REFERENCE TO RELATED APPLICATION

This patent application is a U.S. National Phase Application under 35 U.S.C. § 371 of International Application No. PCT/US2016/055020, filed Sep. 30, 2016, entitled "LAYERED SPACER FORMATION FOR ULTRASHORT CHANNEL LENGTHS AND STAGGERED FIELD PLATES," which designates the United States of America, the entire disclosure of which is hereby incorporated by reference in its entirety and for all purposes.

FIELD OF THE INVENTION

Embodiments of the invention are in the field of semiconductor devices and processing and, in particular, formation of transistors with ultrashort channel lengths and staggered field plates, and methods of forming such devices.

BACKGROUND OF THE INVENTION

Ultrashort channel lengths are needed for high performance mm-wave transistors required for 5G communication technologies. Typically, the channel lengths needed for such applications are approximately 40 nm or less. Forming such small channel lengths requires expensive masks and lithographic solutions.

Additionally, transistors used in such applications are also expected to handle voltages that are typically larger than what is used for advanced silicon nodes. Due to its wide bandgap and high critical breakdown electric field, gallium nitride (GaN) transistors are great candidates for high voltage applications. However, simple transistor architecture, namely, having a single gate, source and drain, is not able to take advantage of these electrical properties. Such GaN transistors fall short of realizing the maximum breakdown voltage dictated by the material properties of GaN because drain electric field lines concentrate at the edge of the gate and cause premature breakdown. The concentration of electric field lines is the result of complex interactions in the device and is typically experienced by most transistors regardless of material used for the channel. However, the electric field line concentration is particularly problematic in GaN transistors due to the high voltages. Accordingly, high voltage transistors may accommodate the electric field line concentration by forming field plates on the gate-to-drain region. The formation of these field plates requires additional patterning operations.

DETAILED DESCRIPTION OF THE INVENTION

Described herein are systems that include a semiconductor device and methods for forming the semiconductor device that includes transistors with ultra-short gate lengths and a gate electrode that includes field plates. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

One solution to reduce electric field line concentration at the edge of the gate is to use a field plate to redistribute the electric field lines towards the field plate instead of toward the edge of the gate electrode. However, currently available devices with field plates have several drawbacks. For example, the formation of multiple field plates requires dedicated masks and processing operations that increase the cost of the device. Embodiments of the invention provide a GaN transistor with field plates and a method to form the field plates without needing multiple masks. Additionally, embodiments of the invention include transistors with small gate lengths (e.g., approximately 60 nm or less) that are made with a single lithography mask. Particularly, embodiments of the invention allow for a lithography mask to pattern openings that are larger than the target gate length by using repeated offset patterning to shrink the gate length to the targeted length. In addition to shrinking the gate length $G_L$, the offset openings also allow for the formation of a gate electrode with integrated field plates.

Figure 1:
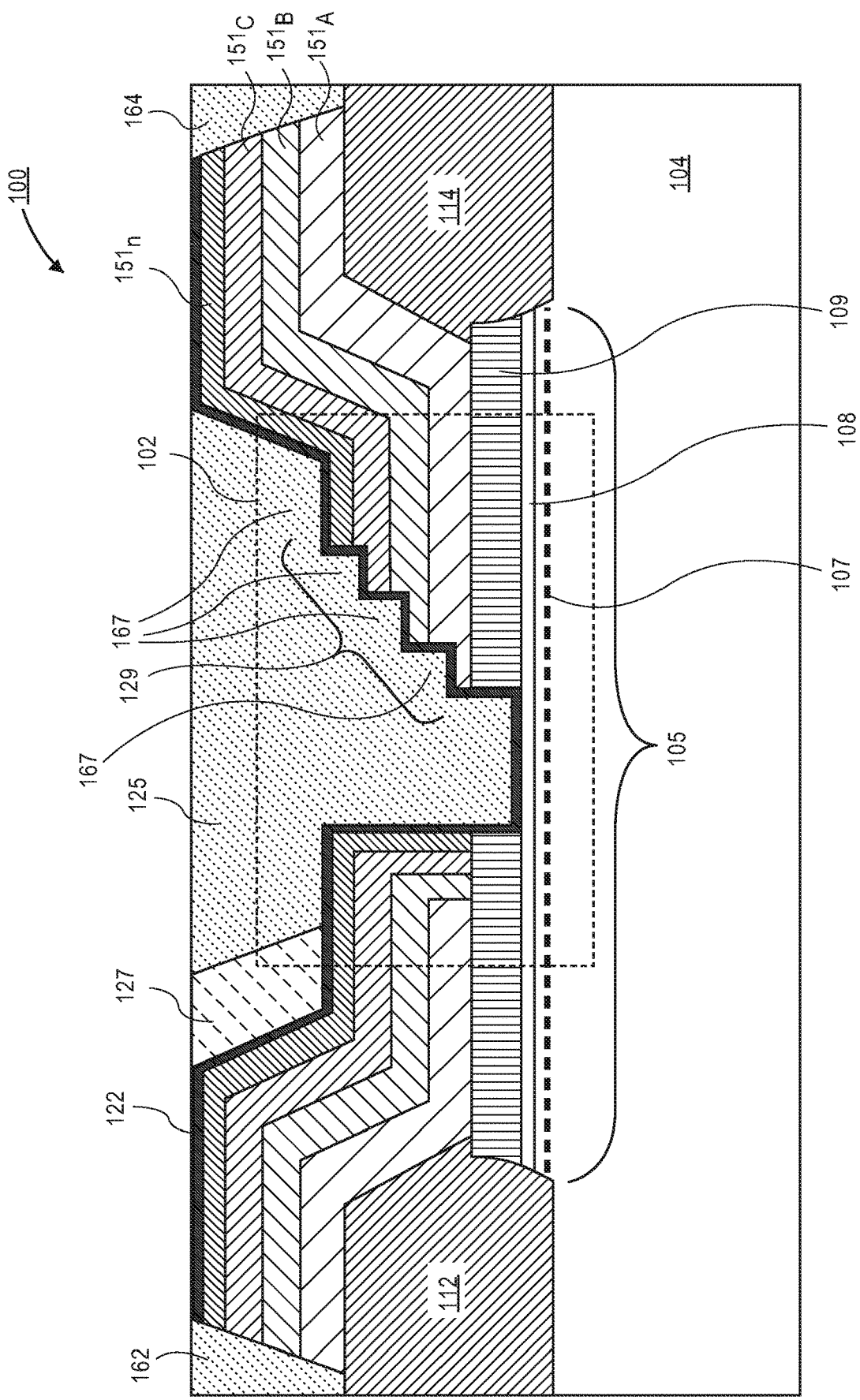
FIG. 1 is a cross-sectional illustration of a transistor that includes an ultra-short gate length and field plates integrated into the gate electrode, according to an embodiment of the invention.

Referring now to FIG. 1, a cross-sectional illustration of a transistor 100 is shown according to an embodiment of the invention. According to an embodiment, the transistor 100 may include a channel 105, source 112, and drain 114. In some embodiments of the invention, the channel 105 may also include a 2-D electron gas 107 (represented as a dashed line) and one or more polarization charge inducing layers 108/109. For example, when the channel 105 is GaN, the polarization charge inducing layers 108/109 may be an AlN layer 108 and an AlInN layer 109. A source electrode 162 may be electrically coupled with the source 112, and a drain electrode 164 may be electrically coupled to the drain 114.

Embodiments of the invention may be formed or carried out on a substrate 104, such as a semiconductor substrate. In one implementation, the semiconductor substrate 104 may be a crystalline substrate formed using a bulk semiconductor or a semiconductor-on-insulator substructure. In one particular embodiment, the semiconductor substrate 104 may include a stack of semiconductor materials. For example, the semiconductor substrate 104 may include a silicon base layer and one or more III-V semiconductor materials grown over the silicon base layer. In one example, a GaN layer may be the active device layer and may be separated from the silicon base layer by one or more buffer layers. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate 104 may be formed are described here, any material that may serve as a foundation upon which a semiconductor device may be built falls within the spirit and scope of the present invention.

While a single transistor 100 is illustrated in FIG. 1, embodiments of the invention include forming a plurality of transistors, such as metal-oxide-semiconductor field-effect transistors (MOSFET or simply MOS transistors) on the substrate. Each MOS transistor includes a gate stack formed of at least two layers, a gate dielectric layer 122 and a gate electrode layer 125. The gate dielectric layer 122 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer 122 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 122 to improve its quality when a high-k material is used.

The gate electrode 125 may be formed on the gate dielectric layer 122 and may consist of at least one P-type workfunction metal or N-type workfunction metal, depending on whether the transistor is to be a PMOS or an NMOS transistor. In some implementations, the gate electrode 125 may consist of a stack of two or more metal layers, where one or more metal layers are workfunction metal layers and at least one metal layer is a fill metal layer.

For a PMOS transistor, metals that may be used for the gate electrode 125 include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode 125 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

As is well known in the art, source regions 112 and drain regions 114 are formed within the substrate on opposite ends of the gate electrode 125 of each MOS transistor 100. The source and drain regions 112/114 are generally formed using either an implantation/diffusion process or an etching/deposition process. In the former process, dopants such as silicon (for forming N-type GaN devices) or magnesium (for forming P-type GaN devices) may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions 112/114. An epitaxial deposition process may then be carried out to fill the recesses with material that is used to fabricate the source and drain regions 112/114. In some embodiments, the epitaxially deposited source and drain regions 112/114 may be doped in situ with dopants. In further embodiments, the source and drain regions 112/114 may be formed using a semiconductor material that is different than the semiconductor material used in the active layer of transistor channel.

One or more interlayer dielectrics (ILD) are deposited over the MOS transistors. In the illustrated embodiment, four ILDs $151_A$-$151_n$ are shown. The ILDs 151 may be formed using dielectric materials known for their applicability in integrated circuit structures, such as low-k dielectric materials. Examples of dielectric materials that may be used include, but are not limited to, poly-Group III nitrides and $SiC_xO_yN_z$ materials. In an embodiment, the ILDs $151_A$-$151_n$ are ordered so that the lowest k-value material is positioned closer to the channel 105 and the largest k-value material is positioned furthest from the channel 105. For example, an ILD stack of poly-Group III nitrides (e.g., AlN, $AlGa_{0.10}N_{0.90}$, $AlGa_{0.40}N_{0.60}$, AlGa) may have k-values that range between approximately 8.5 and 11.0, and an ILD stack of $SiC_xO_yN_z$ materials (e.g., where X is increased with each layer and/or Y is decreased with each layer) may have a k-value ranging between approximately 3.9 and 8.0, depending on the percentage of oxygen and carbon used in each layer. Furthermore, embodiments may include ILDs that include a combination of poly-Group III nitrides and $SiC_XO_YN_Z$ materials to provide an even larger range of possible k-values. Furthermore, while poly-Group III nitrides and $SiC_XO_YN_Z$ materials are explicitly disclosed, embodiments of the invention may also include any ILD material so long as the etch selectivity and k-value are suitable for the layer in which the ILD material is used.

Figure 2A:
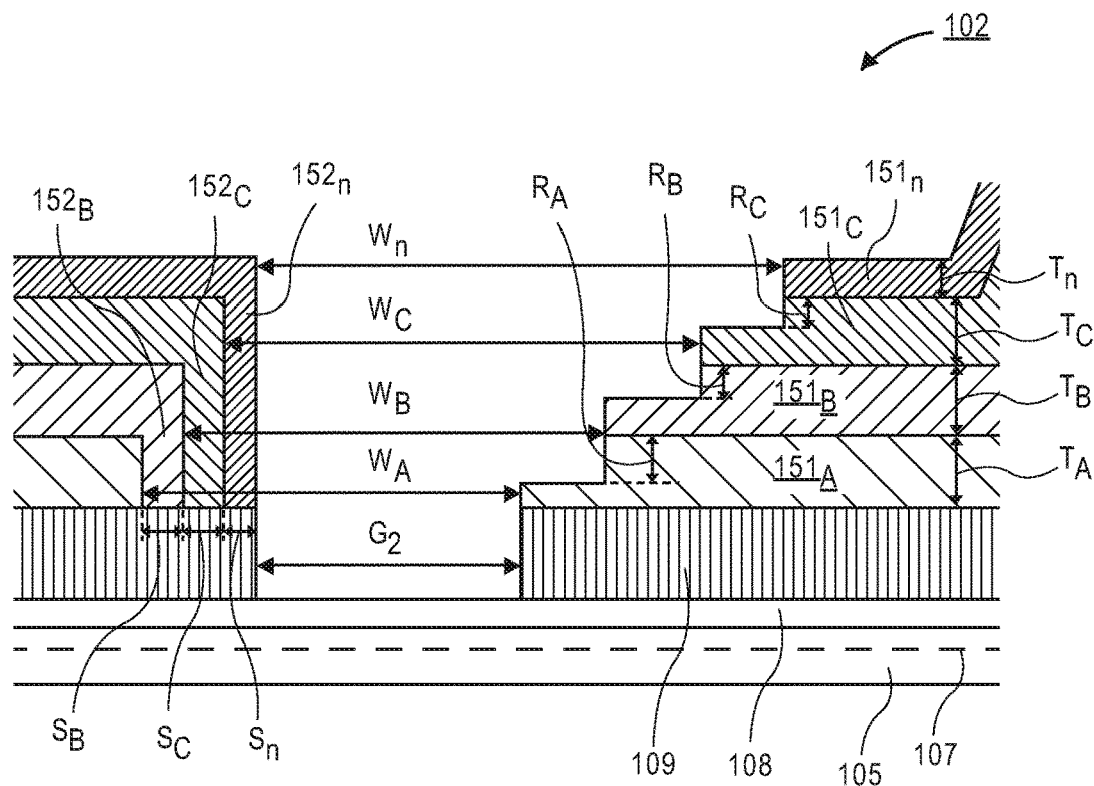
FIG. 2A is a zoomed-in cross-sectional illustration of the gate electrode of the transistor in FIG. 1, according to an embodiment of the invention.
Figure 2B:
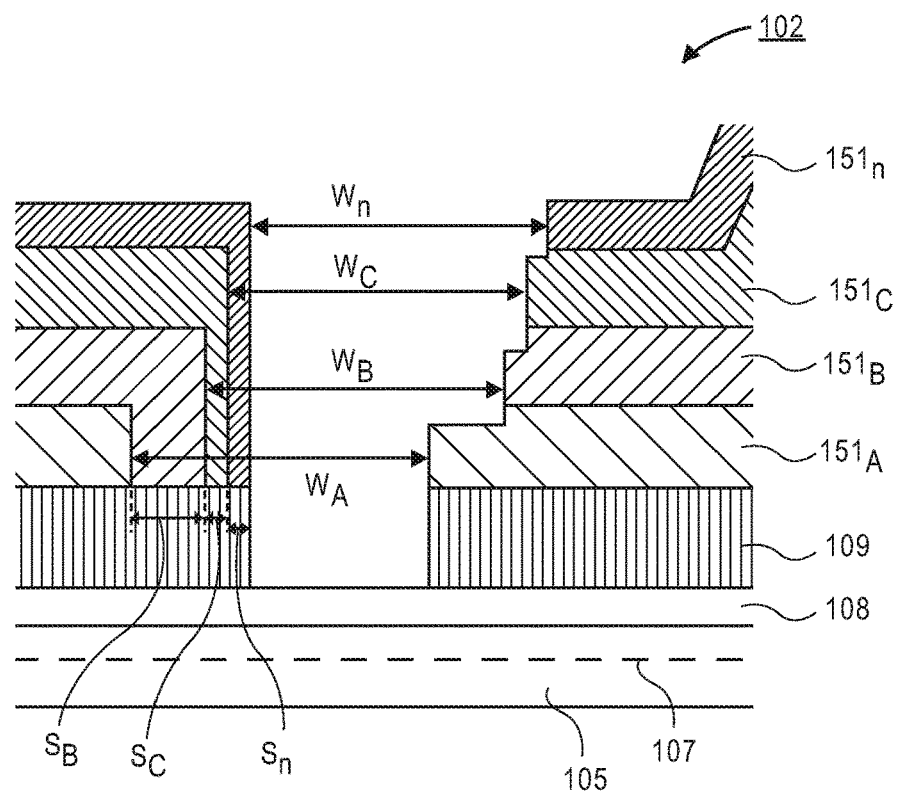
FIG. 2B is a zoomed-in cross-sectional illustration of a gate electrode, according to an additional embodiment of the invention.

In addition to providing a range of k-values that may increase with distance from the channel 105, the use of different material compositions for each ILD 151 provides etch selectivity between the different ILDs 151. Accordingly, each ILD 151 may be etched in a patterning process without completely etching away exposed portions of underlying ILDs 151. This etch selectivity allows for the gate electrode 125 to be formed in an opening that includes a stepped surface 129. The stepped surface 129 of the gate electrode 125 function as field plates 167 that extend toward the drain 114 and allows for the electric field line concentration at the edge of the gate to be reduced since the electric field lines are redistributed towards the field plate surfaces 167 of the gate electrode 125. FIGS. 2A and 2B are zoomed in cross-sectional illustrations that more clearly illustrate the stepped pattern formed into the ILDs 151 in the region within dashed box 102, according to embodiments of the invention.

Referring now to FIG. 2A, openings formed through the ILDs $151_A$-$151_n$ are shown, according to an embodiment of the invention. In order to not obscure the illustration, the gate electrode 125 and the gate dielectric 122 are omitted, though it is to be appreciated, that a gate electrode 125 and a gate dielectric similar to the one illustrated in FIG. 1 may be included in a functioning transistor 100. In an embodiment, an opening is formed through each of the ILDs 151. In an embodiment, the width $W_A$-$W_n$ of each opening through an ILD $151_A$-$151_n$ may be substantially the same, but offset so that the stepped pattern is formed. In such embodiments, a single patterning mask may be used for each patterning operation used to form the openings in each ILD 151, as will be described in greater detail below.

According to an embodiment of the invention, portions of each ILD 151 proximate to the stepped surfaces 129 may have a reduced thickness. For example, ILD $151_A$ is formed with a thickness $T_A$ that is recessed by a distance $R_A$ proximate to the stepped surfaces 129. The recessed distance $R_A$ may be the result of the surface being exposed to an etchant during the formation of openings through subsequently formed ILDs 151. While differences in material composition in each ILD 151 may provide some degree of etch selectivity, embodiments may still result in the removal of some portion of the exposed ILDs 151 in previously formed layers. Due to the different etch selectivities of each ILD material and the number of etching processes each ILD 151 is exposed to, the recess R of each ILD 151 may be different. For example, recess $R_A$ may be greater than recess $R_C$. Furthermore, every ILD $151_A$-$151_n$ may not include a recess. For example, the uppermost ILD $151_n$ may not be exposed to a subsequent etching process, and therefore, may not have a recessed thickness. Additionally, some ILD materials may have etch selectivities that are sufficient to prevent the removal of a substantial portion of the ILD 151. According to an embodiment, the thickness $T_A$-$T_A$ of each ILD $151_A$-$151_n$ may be chosen to account for the corresponding recess R in each layer. For example, if ILD $151_A$ is expected to have a recess $R_A$ that is greater than the expected recess $R_B$ in ILD $151_B$, then the thickness $T_A$ may be chosen to be larger than the thickness $T_B$.

In addition to forming field plates, the offset openings formed through each ILD 151 allows for the gate length $G_L$ to be reduced without adding complexity to the patterning process. For example, when a gate length $G_L$ of approximately 40 nm is needed, the width W of each opening may be 100 nm with each opening being offset by 20 nm. Accordingly, an ultra-small gate length $G_L$ may be produced with existing lithography processes without the need to engineer solutions to overcome scaling to small minimum feature sizes. In an embodiment, the gate length $G_L$ may be less than 100 nm. In an additional embodiment, the gate length $G_L$ may be approximately 40 nm or less. As illustrated in FIG. 2A, offsetting the openings results in the formation of spacers $152_{B-n}$ that reduce the gate length $G_L$. Each spacer $152_{B-n}$ may be the same thickness as the offset used to form the subsequent opening. In embodiments where each opening is offset by the same amount, the thicknesses $S_{B-n}$ of the spacers $152_{B-n}$ may all be substantially equal. However, embodiments are not limited to such configurations.

For example, in FIG. 2B the spacers 152 are illustrated as having different thicknesses S. Such an embodiment may be used to modify the positions of the field plates in the stepped portion 129 (e.g., if a longer field plate is needed closer to the channel 105, then the offset between the first opening in the first ILD $151_A$ and the second opening in the second ILD $151_B$ may be larger than subsequent offsets used to form openings in subsequent ILDs 151). For example, the first offset may be 30 nm and the subsequent offsets may be 15 nm. In such embodiments, the thickness $S_B$ may be 30 nm and the thicknesses $S_C$ and $S_n$ may be approximately 15 nm. Additional embodiments may include offsets that are different for each ILD 151. For example, the offsets may increase with each subsequent ILD 151 level or they may decrease with each subsequent ILD 151 level.

Referring now to FIG. 3A-3K, cross-sectional illustrations of a transistor in various stages of processing are shown, according to an embodiment of the invention. Starting with FIG. 3A, a cross-sectional illustration of an unfinished transistor is shown, according to an embodiment of the invention. At this point in the processing, the source regions 112, drain regions 114, gate, a 2-D electron gas 107 (represented as a dashed line), and one or more polarization charge inducing layers 108/109 have been formed. These components may be formed with any suitable processing operations that are known in the art. Additionally, a first ILD $151_A$ has been formed over the top surfaces of the existing transistor components. According to an embodiment, the first ILD $151_A$ may have the lowest k-value of any subsequently deposited ILDs 151. This allows for improved performance of the transistor due to a reduction in parasitic capacitance. Furthermore, it is to be appreciated that the material used to form the first ILD $151_A$ may be deposited with any suitable process (e.g., sputtering, chemical vapor deposition (CVD), or the like).

Figure 3A:
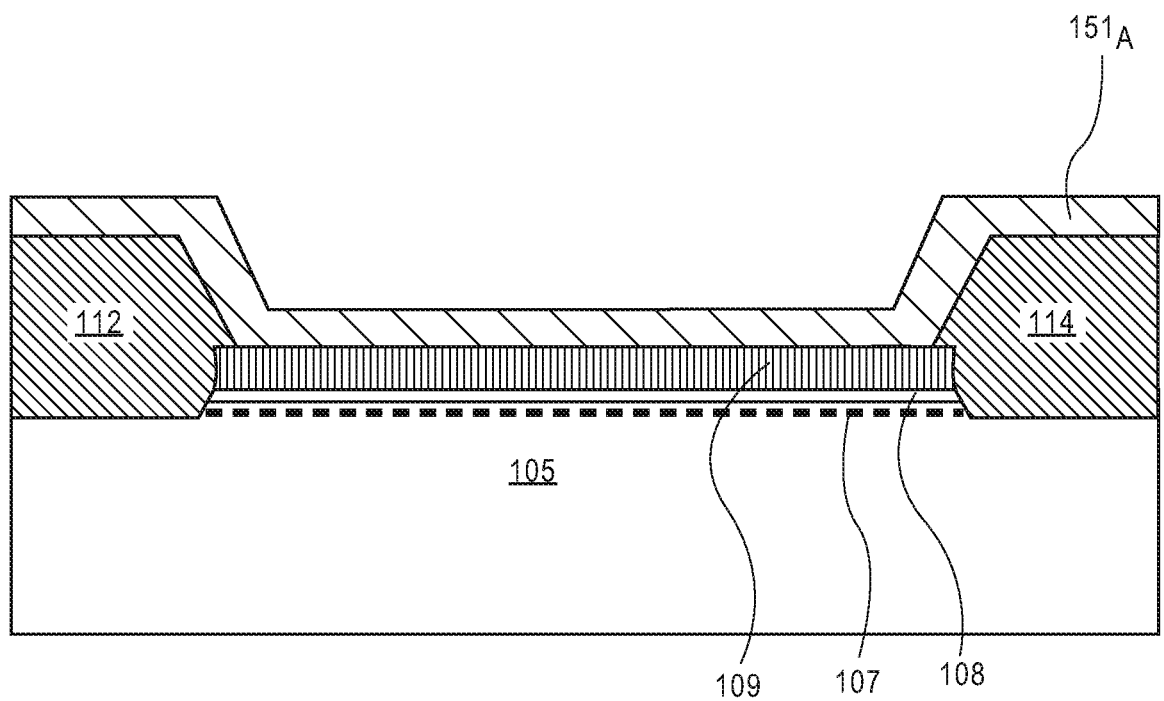
FIG. 3A is a cross-sectional illustration of a portion of a transistor after a first interlayer dielectric (ILD) is formed, according to an embodiment of the invention.
Figure 3B:
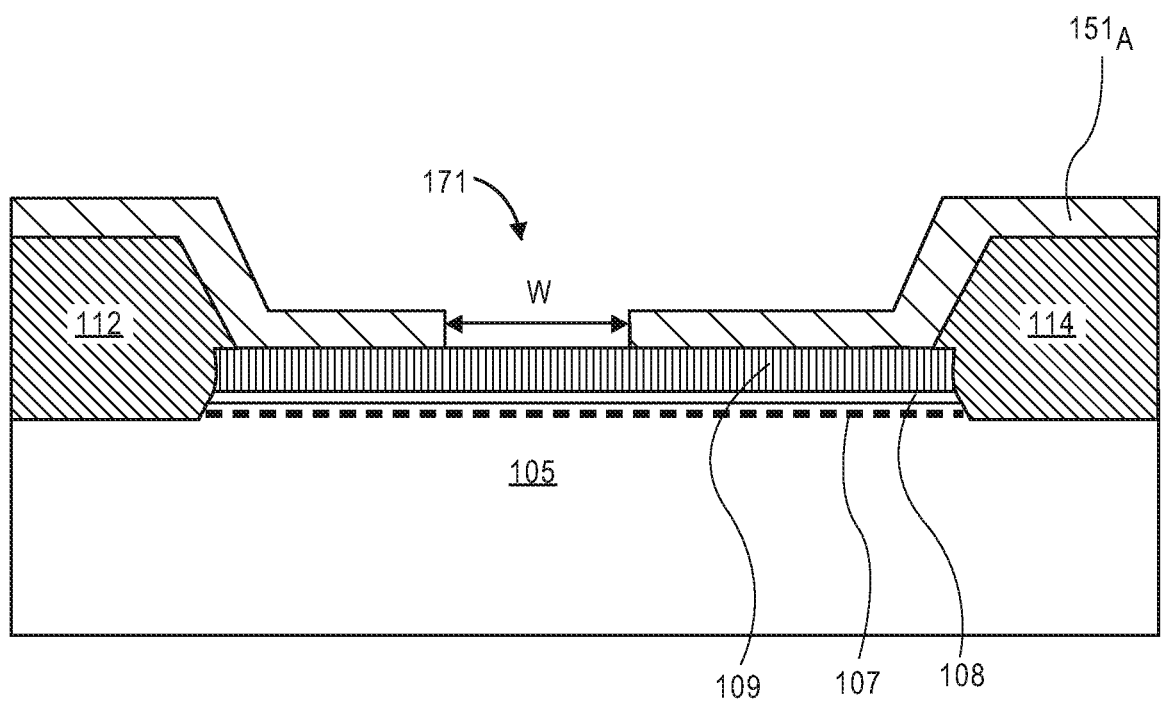
FIG. 3B is a cross-sectional illustration of the transistor in FIG. 3A after the first ILD is patterned to form a first opening, according to an embodiment of the invention.

Referring now to FIG. 3B, a cross-sectional illustration of the transistor after a first opening 171 is formed through the first ILD $151_A$ is shown, according to an embodiment of the invention. According to an embodiment, the first opening 171 may be formed by a typical lithographic process known in the art. For example, a photosensitive resist layer (not shown) may be formed over the first ILD $151_A$, and exposed with radiation through a lithography mask. The photosensitive resist layer may then be developed to form an etching mask used to etch the opening 171 through the first ILD $151_A$. The photosensitive resist layer may then be stripped, leaving behind the patterned first ILD $151_A$ that includes first opening 171. According to an embodiment, the first opening 171 may have a width W that is larger than the desired gate length $G_L$ of the finished transistor. For example, the first opening 171 may have a width between 80 nm and 200 nm. In a particular embodiment, the first opening 171 may have a width that is approximately 100 nm.

Figure 3C:
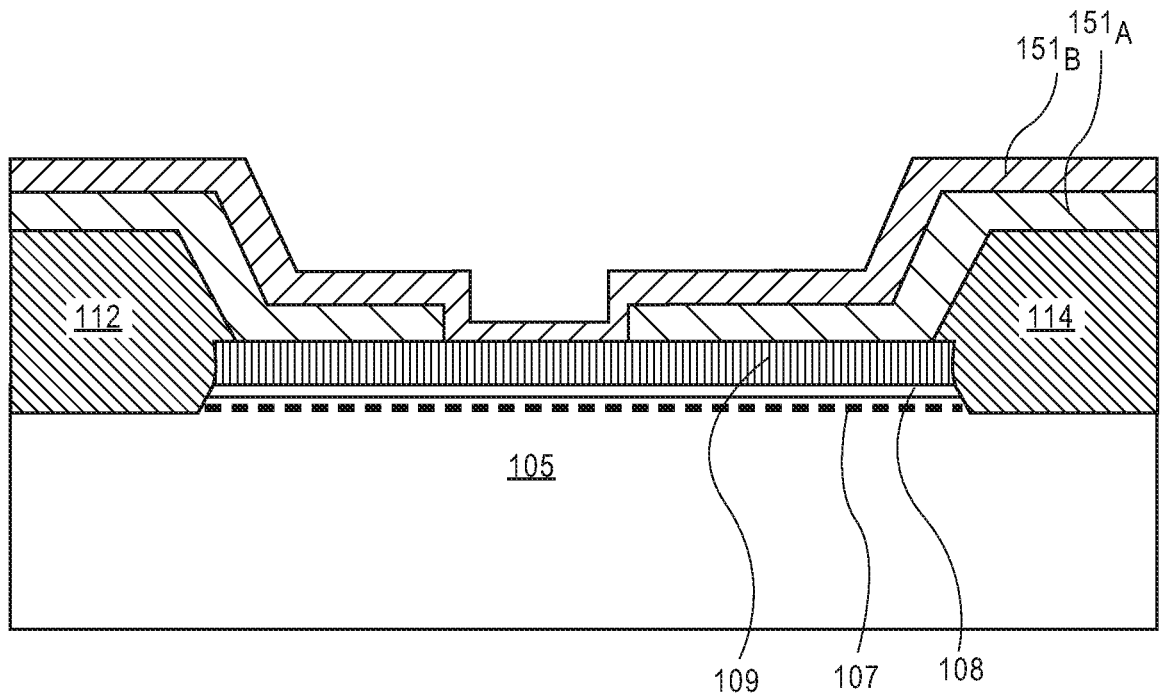
FIG. 3C is a cross-sectional illustration of the transistor in FIG. 3B after a second ILD is formed, according to an embodiment of the invention.

Referring now to FIG. 3C, a cross-sectional illustration of the transistor after a second ILD $151_B$ is formed is shown, according to an embodiment of the invention. As illustrated, the second ILD $151_B$ may be deposited over the first ILD $151_A$ and into the first opening 171. In an embodiment, the second ILD $151_B$ may be any dielectric material, such as those described above. In some embodiments, the second ILD $151_B$ may be a material that has a higher k-value than the k-value of the first ILD $151_A$. Since the second ILD $151_B$ is further form the channel, a higher k-value may be a beneficial trade off if the second ILD $151_B$ is less expensive or may be deposited faster than the first ILD $151_A$. Additionally, the second ILD $151_B$ may be a material that can be etched selectively with respect to the first ILD $151_A$. As used herein, when a first material is said to be etched selectively with respect to a second material, it means that, for a given etching process, the first material will have a faster etch rate than the second material (e.g., the second material does not need to be completely resistant to the given etching process that is used to etch the first material).

Figure 3D:
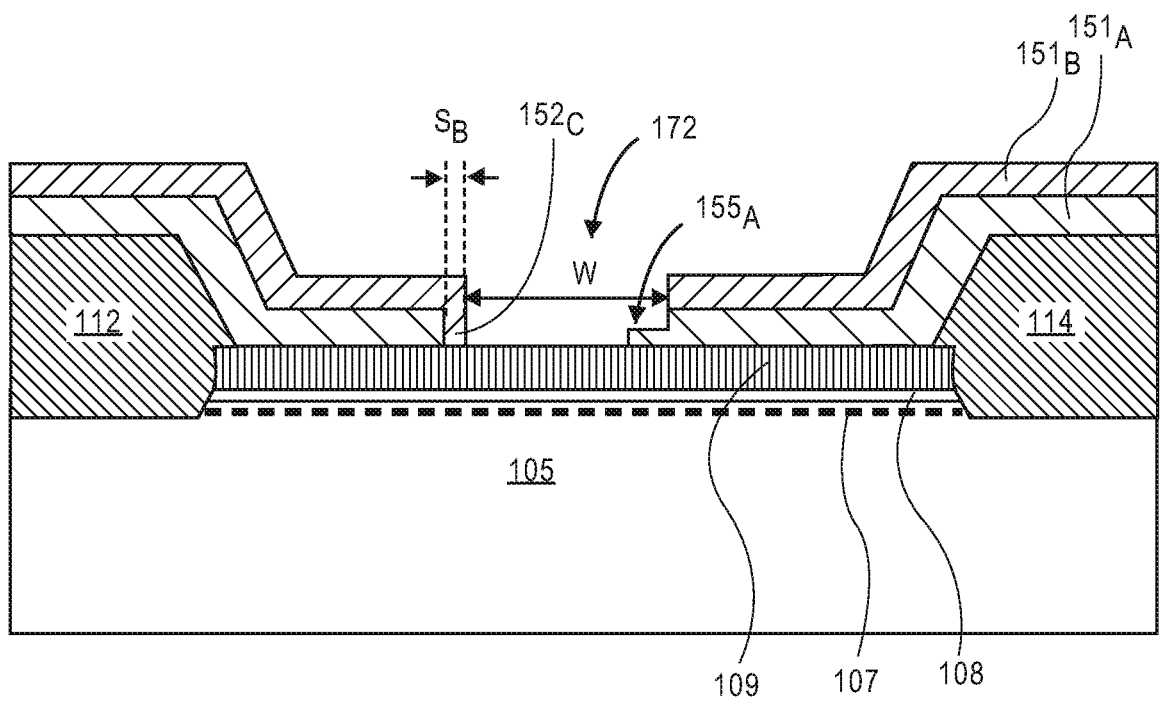
FIG. 3D is a cross-sectional illustration of the transistor in FIG. 3C after the second ILD is patterned to form a second opening, according to an embodiment of the invention.

Referring now to FIG. 3D, a cross-sectional illustration of the transistor after a second opening 172 is formed through the second ILD $151_B$ is shown, according to an embodiment of the invention. According to an embodiment, the second opening 172 may be formed by a typical lithographic processes known in the art. For example, a photosensitive resist layer (not shown) may be formed over the second ILD $151_B$, and exposed with radiation through a lithography mask. The photosensitive resist layer may then be developed to form an etching mask used to etch the opening 172 through the second ILD $151_B$. The photosensitive resist layer may then be stripped, leaving behind the patterned second ILD $151_B$ that includes second opening 172. According to an embodiment, the second opening 172 may be formed with the same lithography mask used to form the first opening 171. Accordingly, the width W of the second opening 172 may be substantially the same as the width W of the first opening 171 formed through the first ILD $151_A$. However, embodiments of the invention include offsetting the second opening 172 from the first opening 171. Accordingly, a portion of the second ILD $151_B$ forms a spacer $152_B$ along an edge of the first opening 171. The spacer $152_B$ has a thickness $S_B$ that is substantially equal to the offset distance used to form the second opening. For example, the thickness $S_B$ of the spacer $152_B$ may be approximately 10 nm or greater. Additional embodiments may include a spacer $152_B$ with a thickness between approximately 15 nm and 40 nm.

Furthermore, the offset used to form the second opening 172 results in the exposure of a portion of the first ILD $151_A$. The exposed portion of the first ILD $151_A$ may be used in a subsequent processing operation as a surface $155_A$ on which a field plate may be formed. In embodiments where the etch selectivity between the first ILD $151_A$ and the second ILD $151_B$ is not perfect, the exposed surface $155_A$ may be recessed below the top surface of the first ILD $151_A$.

Figure 3E:
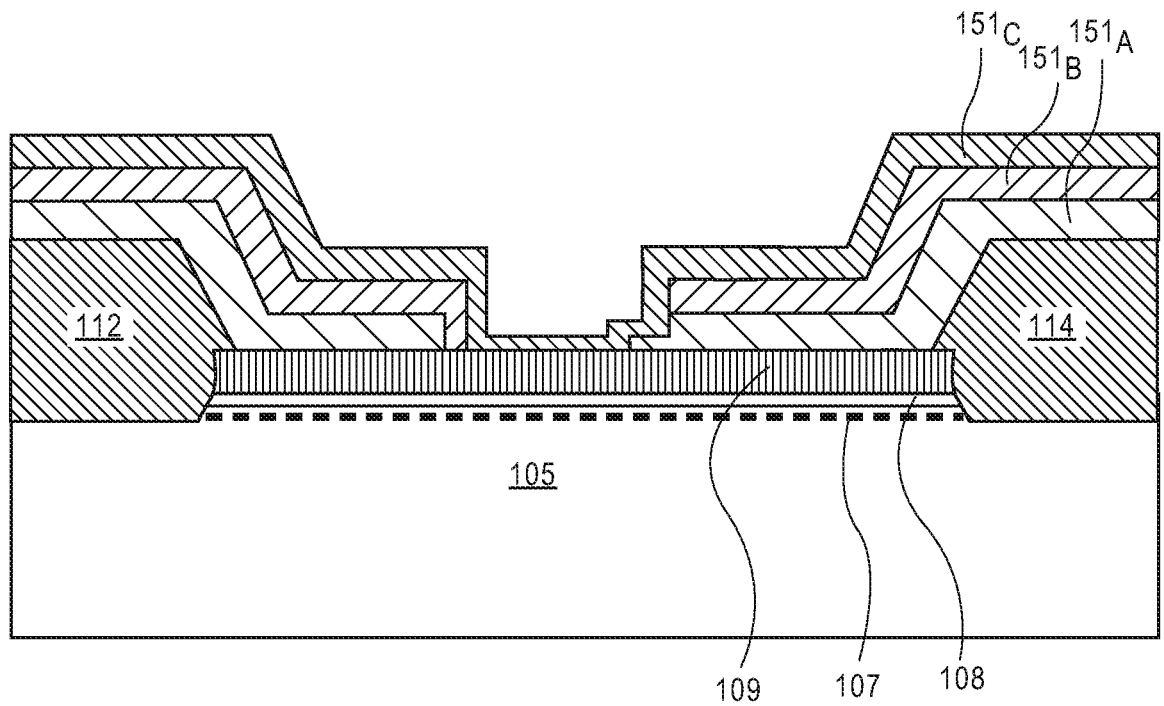
FIG. 3E is a cross-sectional illustration of the transistor in FIG. 3D after a third ILD is formed, according to an embodiment of the invention.

Referring now to FIG. 3E, a cross-sectional illustration of the transistor after a third ILD $151_C$ is formed is shown, according to an embodiment. In an embodiment, the third ILD $151_C$ is deposited over the exposed surfaces of the first ILD $151_A$ and the second ILD $151_B$. The third ILD $151_C$ may be any suitable dielectric material, such as those described above. In an embodiment, the k-value of the third ILD $151_C$ may be higher than the k-value of the second ILD $151_B$. Additionally, the third ILD $151_C$ may be a material that can be etched selectively with respect to the second ILD $151_B$ and the first ILD $151_A$.

Figure 3F:
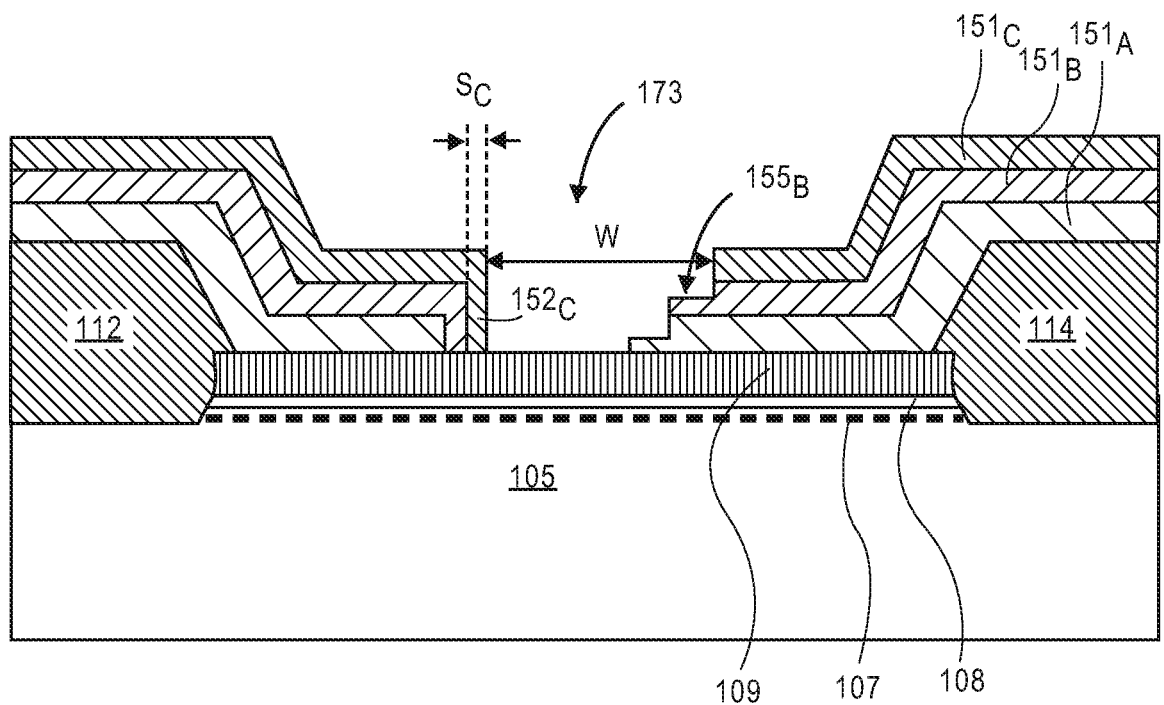
FIG. 3F is a cross-sectional illustration of the transistor in FIG. 3E after the third ILD is patterned to form a third opening, according to an embodiment of the invention.

Referring now to FIG. 3F, a cross-sectional illustration of the transistor after a third opening 173 is formed through the third ILD $151_C$ is shown, according to an embodiment of the invention. According to an embodiment, the third opening 173 may be formed with the same mask used to form the first and second openings 171, 172. Accordingly, the width W of the third opening 173 may be substantially equal to the width of the first and second openings 171, 172. Additionally, the third opening 173 may be offset from the second opening 172 to form a spacer $152_C$ and an exposed surface $155_B$ of the second ILD $151_B$. In embodiments where the offset between the third opening 173 and the second opening 172 is substantially the same as the offset between the second opening 172 and the first opening 171, the thickness $S_C$ of the spacer $152_C$ may be substantially the same as the thickness $S_B$ of the spacer $152_B$. However, embodiments of the invention are not limited to equal offsets between the openings in each layer. Accordingly, some embodiments may include a spacer $152_C$ that has a thickness $S_C$ that is different than the thickness $S_B$ of the spacer $152_B$. Additionally, in some embodiments where the etch selectivity between the ILDs $151_A$, $151_B$, and $151_C$ is not perfect, the exposed surfaces $155_A$ and $155_B$ may also be recessed by the etching process used to form the third opening 173.

Figure 3G:
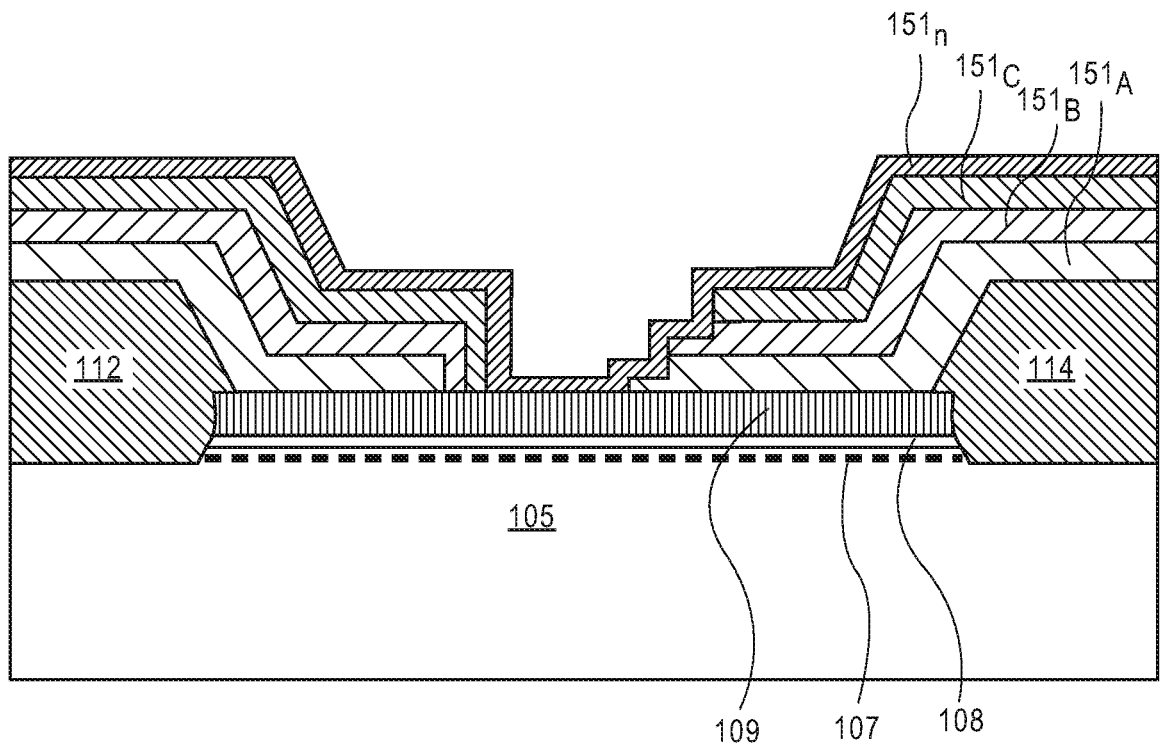
FIG. 3G is a cross-sectional illustration of the transistor in FIG. 3F after a fourth ILD is formed, according to an embodiment of the invention.
Figure 3H:
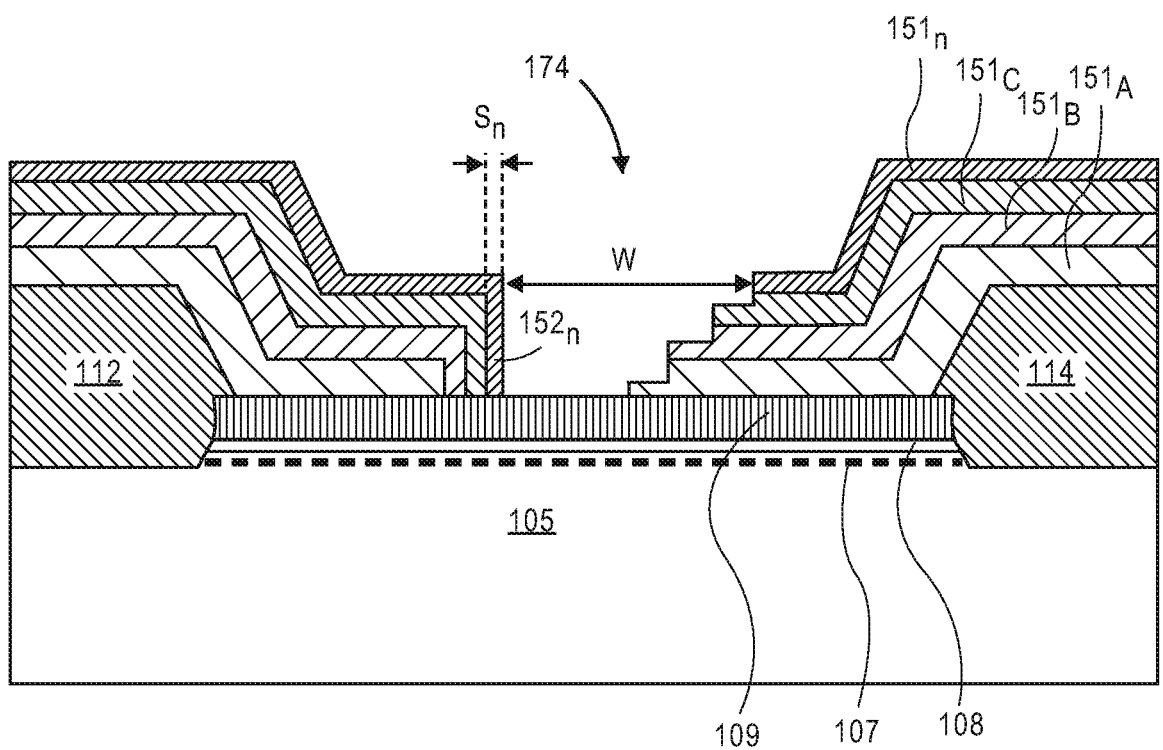
FIG. 3H is a cross-sectional illustration of the transistor in FIG. 3G after the fourth ILD is patterned to form a fourth opening, according to an embodiment of the invention.

Referring now to FIGS. 3G and 3H, cross-sectional illustrations of the transistor after processing operations substantially similar to those described with respect to FIGS. 3E and 3F are shown, according to an embodiment. In FIG. 3G, a fourth ILD $151_n$ is deposited over the exposed surfaces, and in FIG. 3H the fourth ILD $151_n$ is patterned to form a fourth opening 174. The use of the subscript "n" is used to indicate that any number of ILDs 151 may be used, according to various embodiments of the invention. For example, embodiments of the invention may include as few as two ILDs 151 with offset openings, or more than four ILDs 151 with offset openings. However, it is to be appreciated that each opening, 171, 172, 173, 174, etc. may each be formed with the same lithography mask. Accordingly, the width W of the openings may be substantially equal to each other. Additionally, the formation of each offset opening results in the formation of a spacer $152_B$-$152_n$ and an exposed surface $155_A$-$155_n$. Additionally, it is to be appreciated that the thickness S of each spacer 152 is dependent on the offset used to form the opening through the ILD 151 in which the spacer 152 is formed. In embodiments where the offset used for each opening is the same, the spacers 152 may be the same thickness. In embodiments were the offset used for each opening is not the same, the spacers 152 may be different thicknesses. Additionally, in some embodiments where the etch selectivity between the ILDs $151_A$, $151_B$, $151_C$, and $151_n$ is not perfect, the exposed surfaces $155_A$, $155_B$, and $155_C$ may also be recessed by the etching process used to form the fourth opening 174.

Figure 3I:
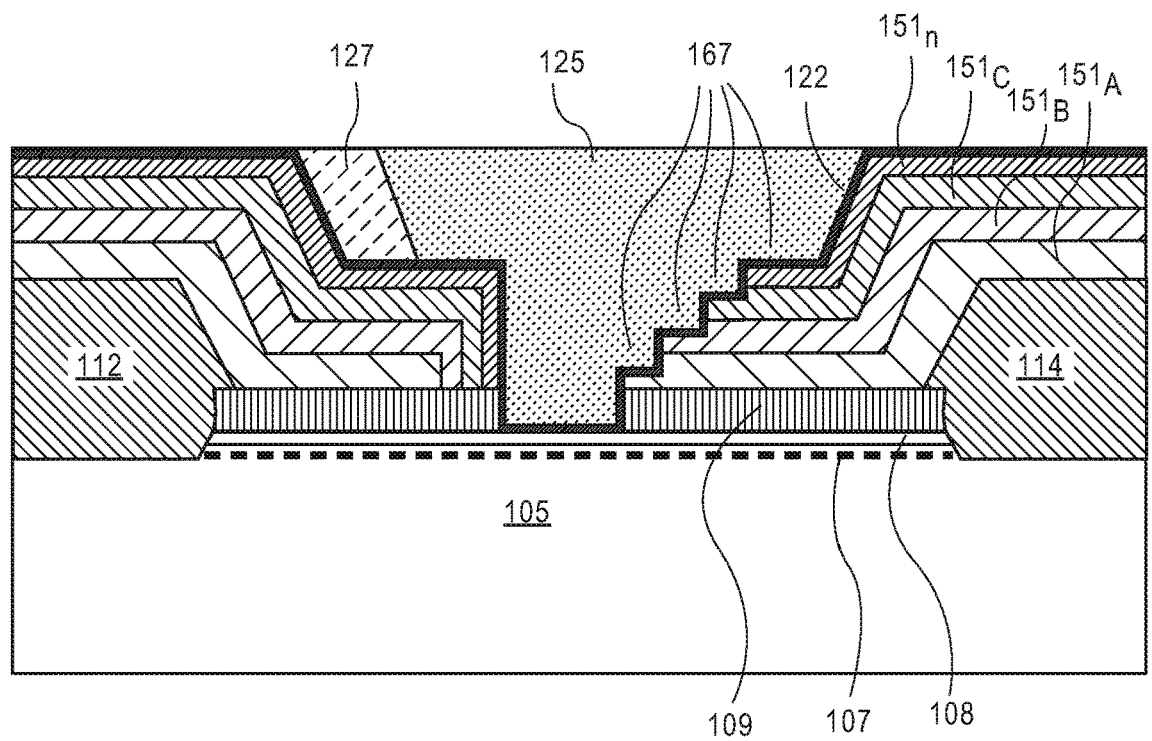
FIG. 3I is a cross-sectional illustration of the transistor in FIG. 3H after a gate dielectric is formed and a gate electrode with field plates is formed, according to an embodiment of the invention.

Referring now to FIG. 3I, a cross-sectional illustration of the transistor after a gate dielectric layer 122 and gate electrode 125 are formed is shown, according to an embodiment of the invention. According to an embodiment, the gate dielectric layer 122 may be formed after etching through portions of polarization layer 109. In an additional embodiment, the polarization layer 109 may be partially recessed. As described above, the gate dielectric layer 122 may be a material with a high-k value, or a stack of one or more high-k dielectric materials. The gate electrode 125 may be any suitable gate electrode material or a stack of one or more gate electrode materials, such as those described above. As illustrated, the gate electrode 125 may also include field plates 167 formed over the stepped surfaces produced by the offset of the openings. Additionally, portions of the opening may be filled with a dielectric material 127 to reduce the volume of metal formed over the channel 105 between the source 112 and the gate 125.

Figure 3J:
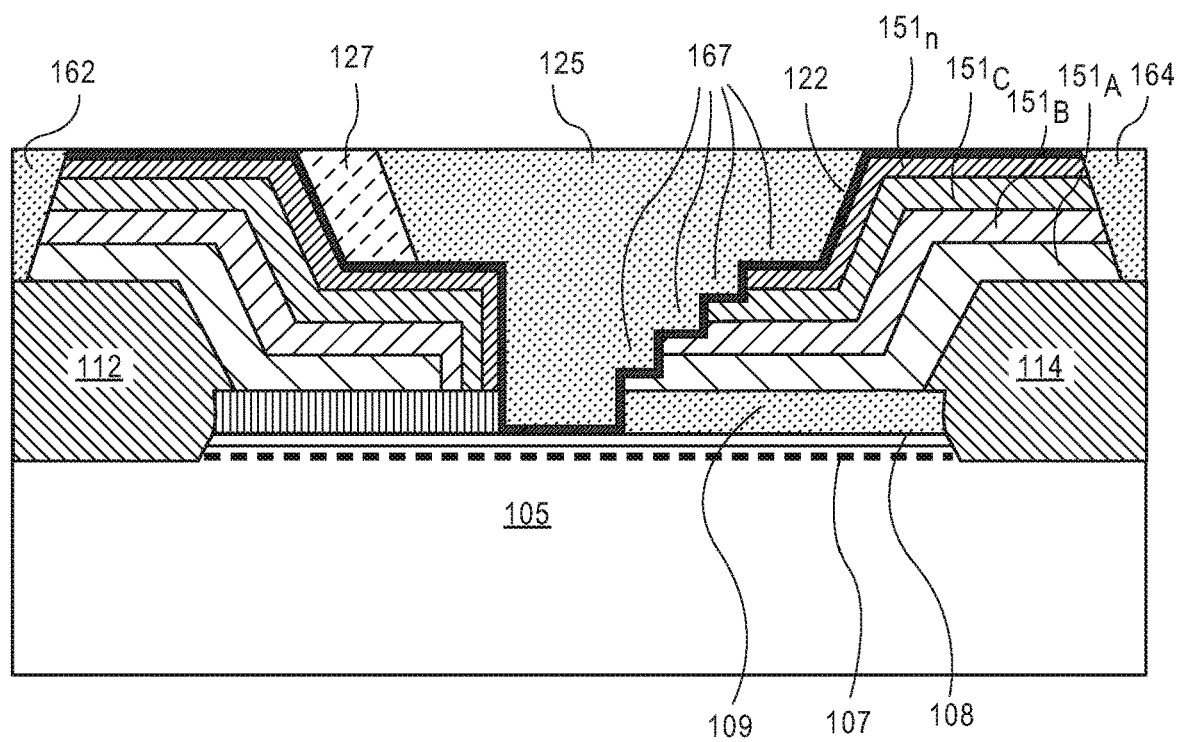
FIG. 3J is a cross-sectional illustration of the transistor in FIG. 3I after the source and drain contacts are formed, according to an embodiment of the invention.

Referring now to FIG. 3J, a cross-sectional illustration of the transistor after source contacts and drain contacts are formed is shown, according to an embodiment of the invention. In an embodiment, the source contacts 162 and the drain contacts 164 may be formed with any suitable contact opening (e.g. lithographic process) and suitable metal deposition process, as are known in the art.

Figure 4:
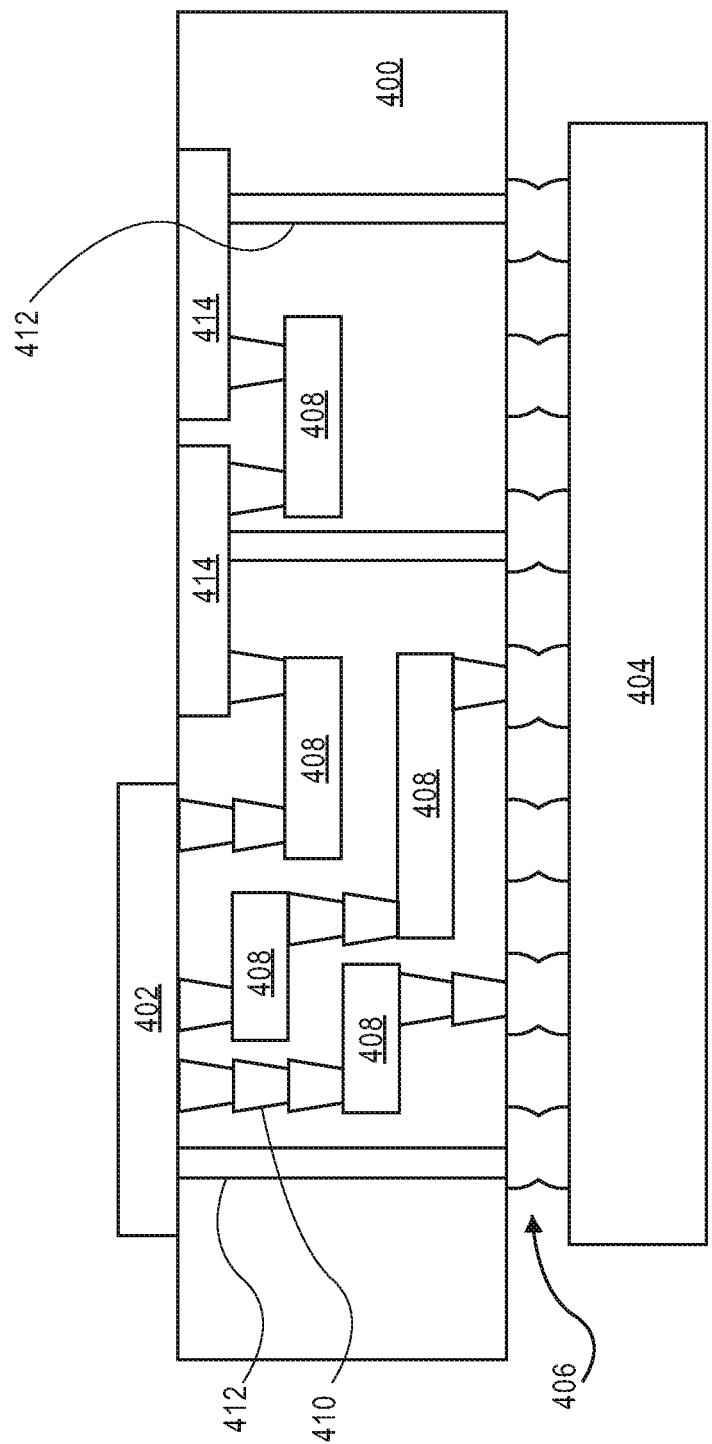
FIG. 4 is a cross-sectional illustration of an interposer implementing one or more embodiments of the invention.

FIG. 4 illustrates an interposer 400 that includes one or more embodiments of the invention. The interposer 400 is an intervening substrate used to bridge a first substrate 402 to a second substrate 404. The first substrate 402 may be, for instance, an integrated circuit die. The second substrate 404 may be, for instance, a memory module, a computer motherboard, or another integrated circuit die. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400.

In accordance with embodiments of the invention, apparatuses that include transistors with one or more field plates that are formed over the channel region, or processes for forming such devices disclosed herein may be used in the fabrication of interposer 400.

Figure 5:
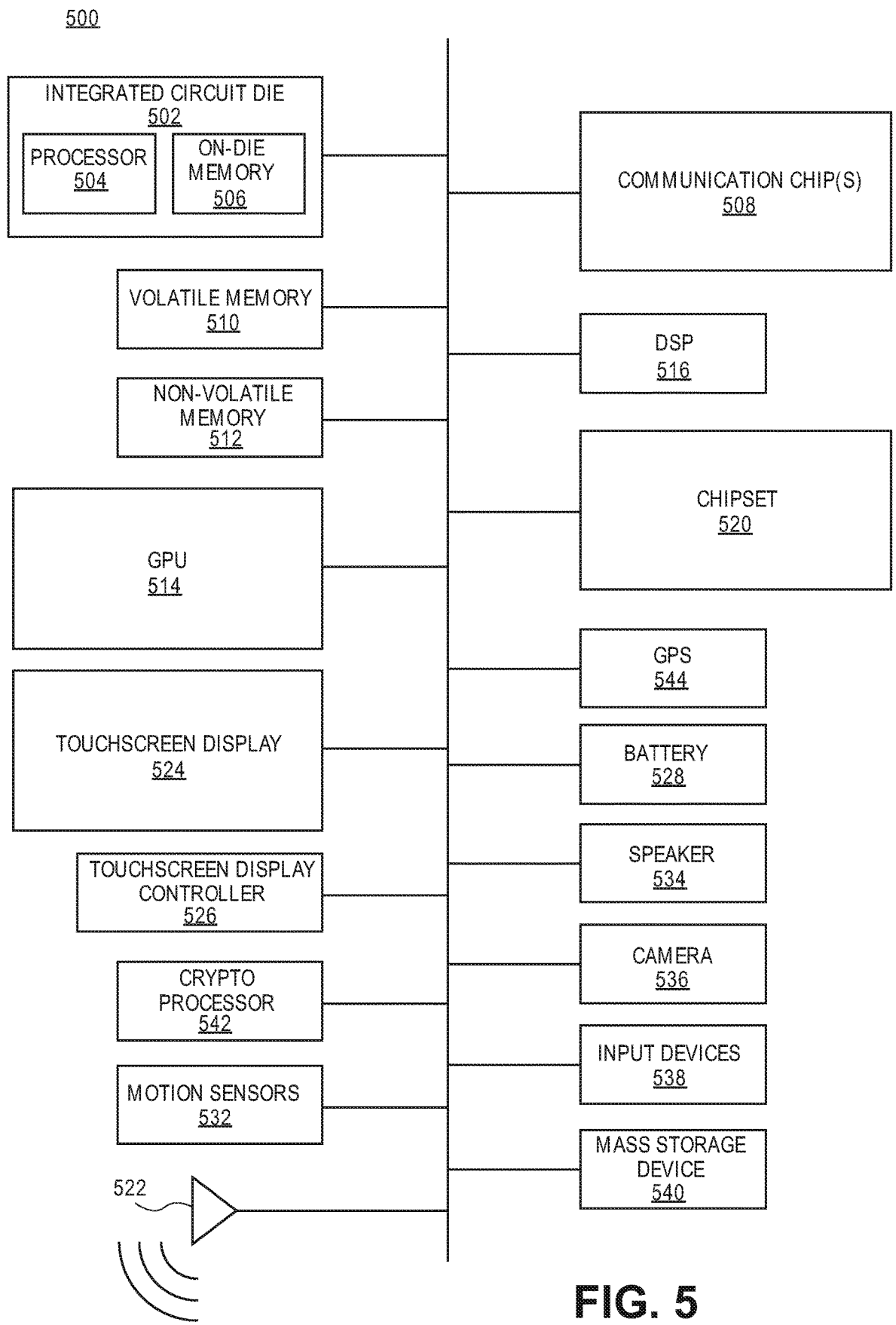
FIG. 5 is a schematic of a computing device that includes one or more transistors built in accordance with an embodiment of the invention.

FIG. 5 illustrates a computing device 500 in accordance with one embodiment of the invention. The computing device 500 may include a number of components. In one embodiment, these components are attached to one or more motherboards. In an alternate embodiment, these components are fabricated onto a single system-on-a-chip (SoC) die rather than a motherboard. The components in the computing device 500 include, but are not limited to, an integrated circuit die 502 and at least one communication chip 508. In some implementations the communication chip 508 is fabricated as part of the integrated circuit die 502. The integrated circuit die 502 may include a CPU 504 as well as on-die memory 506, often used as cache memory, that can be provided by technologies such as embedded DRAM (eDRAM) or spin-transfer torque memory (STTM or STTM-RAM).

Computing device 500 may include other components that may or may not be physically and electrically coupled to the motherboard or fabricated within an SoC die. These other components include, but are not limited to, volatile memory 510 (e.g., DRAM), non-volatile memory 512 (e.g., ROM or flash memory), a graphics processing unit 514 (GPU), a digital signal processor 516, a crypto processor 542 (a specialized processor that executes cryptographic algorithms within hardware), a chipset 520, an antenna 522, a display or a touchscreen display 524, a touchscreen controller 526, a battery 528 or other power source, a power amplifier (not shown), a global positioning system (GPS) device 544, a compass 530, a motion coprocessor or sensors 532 (that may include an accelerometer, a gyroscope, and a compass), a speaker 534, a camera 536, user input devices 538 (such as a keyboard, mouse, stylus, and touchpad), and a mass storage device 540 (such as hard disk drive, compact disk (CD), digital versatile disk (DVD), and so forth).

The communications chip 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 508. For instance, a first communication chip 508 may be dedicated to shorter range wireless communications such as Wi-Fi and Bluetooth and a second communication chip 508 may be dedicated to longer range wireless communications such as GPS, EDGE, GPRS, CDMA, WiMAX, LTE, Ev-DO, and others.

The processor 504 of the computing device 500 includes one or more devices, such as transistors with one or more field plates that are formed over the channel region, according to an embodiment of the invention. The term "processor" may refer to any device or portion of a device that processes electronic data from registers and/or memory to transform that electronic data into other electronic data that may be stored in registers and/or memory.

The communication chip 508 may also include one or more devices, such as one or more transistors with one or more field plates that are formed over the channel region, according to an embodiment of the invention.

In further embodiments, another component housed within the computing device 500 may contain one or more devices, such as transistors that include one or more field plates that are formed over the channel region, or processes for forming such devices, according to an embodiment of the invention.

In various embodiments, the computing device 500 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a semiconductor device comprising: a semiconductor substrate having a source region, a drain region, and a channel region formed between the source region and drain region; a first interlayer dielectric (ILD) formed over the channel region, wherein a first opening is formed through the first ILD; a second ILD formed over the first ILD, wherein a second opening is formed through the second ILD, and wherein the second opening is offset from the first opening; and a gate electrode formed through the first opening and the second opening.

Example 2: the semiconductor device of Example 1, wherein a first spacer formed from the second ILD is formed along a first edge of the first opening, and wherein the spacer reduces a gate length of the semiconductor device to be less than a width of the first opening.

Example 3: the semiconductor device of Example 1 or Example 2, further comprising a first field plate formed over a portion of the first ILD.

Example 4: the semiconductor device of Example 3, wherein the portion of the first ILD below the first field plate has a thickness that is less than a thickness of the remaining portions of the first ILD.

Example 5: the semiconductor device of Example 1, Example 2, or Example 3, or Example 4, further comprising a third ILD formed over the second ILD, wherein a third opening is formed through the third ILD, and the third opening is offset from the second opening.

Example 6: the semiconductor device of Example 5, further comprising a second field plate formed over a surface of the second ILD.

Example 7: the semiconductor device of Example 1, Example 2, Example 3, Example 4, Example 5, or Example 6, wherein the second opening has a width substantially the same as a width of the first opening.

Example 8: the semiconductor device of Example 5, Example 6, or Example 7, wherein the third opening has a width substantially the same as a width of the second opening.

Example 9: the semiconductor device of Example 5, Example 6, Example 7, or Example 8, wherein the offset between the third opening and the second opening is different than the offset between the second opening and the first opening.

Example 10: the semiconductor device of Example 1, Example 2, Example 3, Example 4, Example 5, Example 6, Example 7, Example 8, or Example 9, wherein the first ILD is a different material than the second ILD.

Example 11: the semiconductor device of Example 1, Example 2, Example 3, Example 4, Example 5, Example 6, Example 7, Example 8, Example 9, or Example 10, wherein the second ILD is etch selective to the first ILD.

Example 12: the semiconductor device of Example 1, Example 2, Example 3, Example 4, Example 5, Example 6, Example 7, Example 8, Example 9, Example 10, or Example 11, wherein the first ILD and the second ILD are poly-Group III nitrides and/or $SiC_XO_YN_Z$.

Example 13: the semiconductor device of Example 1, Example 2, Example 3, Example 4, Example 5, Example 6, Example 7, Example 8, Example 9, Example 10, Example 11, or Example 12, wherein the first opening is greater than 100 nm and a gate length of the semiconductor device is less than 60 nm.

Example 14: the semiconductor device of Example 1, Example 2, Example 3, Example 4, Example 5, Example 6, Example 7, Example 8, Example 9, Example 10, Example 11, Example 12, or Example 13, wherein the gate length is approximately 40 nm or less.

Example 15: a method of forming semiconductor device, comprising: forming a transistor that includes a source region, a drain region, and a channel region between the source and drain region; forming a first interlayer dielectric (ILD) over the channel region; patterning the first ILD to form a first opening; forming a second ILD over the first ILD; patterning the second ILD to form a second opening, wherein the second opening is offset from the first opening and produces a first spacer along a first edge of the first opening, and an exposed portion of the first ILD; forming a third ILD over the second ILD; patterning the third ILD to form a third opening, wherein the third opening is offset from the second opening and produces a second spacer proximate to the first spacer and an exposed portion of the second ILD; and depositing a conductive material into the openings to form a gate electrode, a first field plate, and a second field plate.

Example 16: the method of Example 15, wherein the first ILD, the second ILD, and the third ILD are different materials.

Example 17: the method of Example 15 or Example 16, wherein the first ILD, the second ILD, and the third ILD are poly-Group III nitrides and/or $SiC_XO_YN_Z$.

Example 18: the method of Example 15, Example 16, or Example 17, wherein the exposed portion of the first ILD has a thickness that is less than a thickness of the remaining portions of the first ILD, and wherein the exposed portion of the second ILD is less than a thickness of the remaining portions of the second ILD.

Example 19: the method of Example 15, Example 16, Example 17, or Example 18, wherein a difference between the thicknesses of the exposed portion of the first ILD and the remaining portions of the first ILD is greater than a difference between the thickness of the exposed portion of the second ILD and the remaining portions of the second ILD.

Example 20: the method of Example 15, Example 16, Example 17, Example 18, or Example 19, wherein the first field plate is formed over the exposed portion of the first ILD and the second field plate is formed over the exposed portion of the second ILD.

Example 21: the method of Example 15, Example 16, Example 17, Example 18, Example 19, or Example 20, wherein the first, second, and third openings have a width that is substantially the same.

Example 22: the method of Example 15, Example 16, Example 17, Example 18, Example 19, Example 20, or Example 21, wherein the first spacer and the second spacer have a thickness that are substantially the same.

Example 23: a semiconductor device comprising: a semiconductor substrate having a source region, a drain region, and a channel region formed between the source region and drain region; a stack of two or more interlayer dielectrics (ILDs) formed over the channel region; an opening formed through each of the ILDs in the stack, wherein each opening has substantially the same width, and wherein each opening is offset from other openings; and a gate electrode formed in the openings.

Example 24: the semiconductor device of Example 23, wherein each ILD includes an exposed portion, wherein a field plate is formed over each exposed portion.

Example 25: the semiconductor device of Example 23 or Example 24, wherein at least one of the ILDs includes a spacer formed along an edge of an opening in a lower ILD layer.

What is claimed is:

1. A semiconductor device comprising:
   a semiconductor substrate having a source region, a drain region, and a channel region formed between the source region and drain region;
   a first interlayer dielectric (ILD) formed over the channel region, wherein a first opening is formed through the first ILD;
   a second ILD formed over the first ILD, wherein a second opening is formed through the second ILD, and wherein the second opening is offset from the first opening;
   and a gate electrode formed through the first opening and the second opening.

2. The semiconductor device of claim 1, wherein a first spacer formed from the second ILD is formed along a first edge of the first opening, and wherein the spacer reduces a gate length of the semiconductor device to be less than a width of the first opening.

3. The semiconductor device of claim 2, further comprising a first field plate formed over a portion of the first ILD.

4. The semiconductor device of claim 3, wherein the portion of the first ILD below the first field plate has a thickness that is less than a thickness of the remaining portions of the first ILD.

5. The semiconductor device of claim 1, further comprising a third ILD formed over the second ILD, wherein a third opening is formed through the third ILD, and the third opening is offset from the second opening.

6. The semiconductor device of claim 5, further comprising a second field plate formed over a surface of the second ILD.

7. The semiconductor device of claim 6, wherein the second opening has a width substantially the same as a width of the first opening.

8. The semiconductor device of claim 7, wherein the third opening has a width substantially the same as a width of the second opening.

9. The semiconductor device of claim 7, wherein the offset between the third opening and the second opening is different than the offset between the second opening and the first opening.

10. The semiconductor device of claim 1, wherein the first ILD is a different material than the second ILD.

11. The semiconductor device of claim 10, wherein the second ILD is etch selective to the first ILD.

12. The semiconductor device of claim 10, wherein the first ILD and the second ILD are poly-Group III nitrides and/or $SiC_xO_yN_z$.

13. The semiconductor device of claim 1, wherein the first opening is greater than 100 nm and a gate length of the semiconductor device is less than 60 nm.

14. The semiconductor device of claim 13, wherein the gate length is approximately 40 nm or less.

15. A semiconductor device comprising:
   a semiconductor substrate having a source region, a drain region, and a channel region formed between the source region and drain region;
   a stack of two or more interlayer dielectrics (ILDs) formed over the channel region;
   an opening formed through each of the ILDs in the stack, wherein each opening has substantially the same width, and wherein each opening is offset from other openings; and
   a gate electrode formed in the openings.

16. The semiconductor device of claim 15, wherein each ILD includes an exposed portion, wherein a field plate is formed over each exposed portion.

17. The semiconductor device of claim 15, wherein at least one of the ILDs includes a spacer formed along an edge of an opening in a lower ILD layer.

* * * * *